(12) United States Patent
Kinyua

(10) Patent No.: US 10,461,761 B2
(45) Date of Patent: *Oct. 29, 2019

(54) PIPELINED SAR WITH TDC CONVERTER

(71) Applicant: Taiwan Semiconductor Manufacturing Co., Ltd., Hsin-Chu (TW)

(72) Inventor: Martin Kinyua, Cedar Park, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/220,358

(22) Filed: Dec. 14, 2018

(65) Prior Publication Data

US 2019/0123752 A1    Apr. 25, 2019

Related U.S. Application Data

(63) Continuation of application No. 15/903,711, filed on Feb. 23, 2018, now Pat. No. 10,171,096, which is a
(Continued)

(51) Int. Cl.
   *H03M 1/10*      (2006.01)
   *H03M 1/12*      (2006.01)
   (Continued)

(52) U.S. Cl.
   CPC ........ *H03M 1/0607* (2013.01); *G04F 10/005* (2013.01); *H03M 1/1245* (2013.01);
   (Continued)

(58) Field of Classification Search
   CPC ...... H03M 1/468; H03M 1/802; H03M 1/804; H03M 1/806; H03M 1/12; H03M 1/124; H03M 1/1245; G04F 10/005; G11C 27/02
   (Continued)

(56) References Cited

U.S. PATENT DOCUMENTS 5,684,487 A    11/1997   Timko
5,852,415 A    12/1998   Cotter et al.
(Continued)

OTHER PUBLICATIONS

Maximintegrated.com "Understanding SAR ADCS: Their Architecture and Comparison with Other ADCS." Oct. 2, 2001.
(Continued)

*Primary Examiner* — Jean B Jeanglaude
(74) *Attorney, Agent, or Firm* — Eschweller & Potashnik, LLC

(57) ABSTRACT

An analog-to-digital converter (ADC) is disclosed. The ADC includes a successive approximation register and a voltage-to-time conversion element. The successive approximation register is configured to receive an input signal and to generate a first digital signal and a residue voltage. The voltage-to-time conversion element is configured to convert the residue voltage to a time domain representation. The voltage-to-time conversion element includes an amplifier having an input coupled to an output of the successive approximation register and configured to receive the residue voltage, and a zero crossing detector directly coupled to an output of the amplifier. A time-to-digital converter is coupled to an output of the zero crossing detector and is configured to generate a second digital signal.

20 Claims, 5 Drawing Sheets

Related U.S. Application Data continuation of application No. 15/590,247, filed on May 9, 2017, now Pat. No. 9,923,568, which is a continuation of application No. 14/959,064, filed on Dec. 4, 2015, now Pat. No. 9,673,835.

(51) Int. Cl.
  *H03M 1/06* (2006.01)
  *H03M 1/46* (2006.01)
  *H03M 1/14* (2006.01)
  *G04F 10/00* (2006.01)
  *H03M 1/54* (2006.01)

(52) U.S. Cl.
  CPC ........... *H03M 1/145* (2013.01); *H03M 1/468* (2013.01); *H03M 1/54* (2013.01)

(58) Field of Classification Search
  USPC .................. 341/120, 172, 155, 161, 118
  See application file for complete search history.

(56) References Cited

U.S. PATENT DOCUMENTS

| | | | |
|---|---|---|---|
| 6,879,277 B1* | 4/2005 | Cai | H03M 1/164 341/155 |
| 6,914,550 B2* | 7/2005 | Cai | H03M 1/164 341/150 |
| 7,233,273 B2 | 6/2007 | Tachibana et al. | |
| 7,652,604 B2 | 1/2010 | Parayandeh et al. | |
| 8,040,264 B2 | 10/2011 | Hummerston et al. | |
| 8,471,751 B2 | 6/2013 | Wang | |
| 8,736,480 B1 | 5/2014 | Cowley et al. | |
| 8,854,243 B2 | 10/2014 | Yoshioka et al. | |
| 2011/0102219 A1 | 5/2011 | Jeong et al. | |
| 2013/0002467 A1 | 1/2013 | Wang | |
| 2013/0321189 A1 | 12/2013 | Yoshioka et al. | |

OTHER PUBLICATIONS

Oh, Taehwan, et al. "A 5MHz BW 70.7dB SNDR Noise-Shaped Two-Step Quantizer Based ADC." IEEE 2012 Symposium on VLSI Circuits Digest of Technical Papers. Jun. 13-15, 2012.

Yang, et al. "Time-Based Energy-Efficient Analog-to-Digital Converter." IEEE Journal of Solid-State Circuits, vol. 40, No. 8, Aug. 2005.

McCreary, et al. "All-MOS Charge Redistribution Analog-to-Digital Conversion Techniques Part I." IEEE Journal of Solid-State Circuits, vol. SC-10, No. 6, Dec. 1975.

Yao, Chen. "Time to Digital Converter Used in ALL Digital PLL." Master of Science Thesis in System-on-Chip Design, Stockholm. Aug. 2011.

Rikan, et al. "Digital Error Correction for a 10-Bit Straightforward SAR ADC." IEIE Transactions on Smart Processing and Computing, vol. 4, No. 1, Feb. 2015.

Nastase, Adrian. "Open-Loop, Closed-Loop and Feedback Questions and Answers." Retrieved from: http://masteringelectronicsdesign.com/open-loop-closed-loop-and-feedback-questions-and-answers/ May 31, 2013.

Lee, et al. "A 12b 50MS/s 3.5mW SAR Assisted 2-Stage Pipeline ADC." IEEE 2010 Symposium on VLSI Circuits/Technical Digest of Technical Papers. Jun. 2010.

Zhou, et al. "A 12b 160MS/s Synchronous Two-Step SAR ADC Achieving 20.7fJ/step FoM with Opportunistic Digital Background Calibration." IEEE 2014 Symposium on VLSI Circuits Digest of Technical Papers. Jun. 2014.

Verbruggen, et al. "1.7mW 11b 250MS/s 2× Interleaved Fully Dynamic Pipelined SAR ADC in 40nm Digital CMOS." 2012 IEEE International Solid-State Circuits Conference. Oct. 18, 2012.

Lin, et al. "A 12-bit 210-MS/s 5.3-mW Pipelined-SAR ADC with a Passive Residue Transfer Technique." IEEE 2014 Symposium on VLSI Circuits Digest of Technical Papers. Jun. 2014.

Verbruggen, et al. "A 2.1 mW 11b 410 MS/s Dynamic Pipelined SAR ADC with Background Calibration in 28nm Digital CMOS." IEEE 2014 Symposium on VLSI Circuits Digest of Technical Papers. Jun. 2013.

Non-Final Office Action dated Sep. 29, 2016 for U.S. Appl. No. 14/959,064.

Notice of Allowance dated Feb. 7, 2017 for U.S. Appl. No. 14/959,064.

Non-Final Office Action dated Jun. 27, 2017 for U.S. Appl. No. 15/590,247.

Notice of Allowance dated Nov. 7, 2017 for U.S. Appl. No. 15/590,247.

Non-Final Office Action dated Apr. 26, 2018 for U.S. Appl. No. 15/903,711.

Notice of Allowance dated Sep. 12, 2018 for U.S. Appl. No. 15/903,711.

\* cited by examiner

US 10,461,761 B2

PIPELINED SAR WITH TDC CONVERTER

REFERENCE TO RELATED APPLICATIONS

This application is a Continuation of U.S. application Ser. No. 15/903,711, filed on Feb. 23, 2018, which is a Continuation of U.S. application Ser. No. 15/590,247, filed on May 9, 2017 (now U.S. Pat. No. 9,923,568, issued on Mar. 20, 2018), which is a Continuation of U.S. application Ser. No. 14/959,064, filed on Dec. 4, 2015 (now U.S. Pat. No. 9,673,835, issued on Jun. 6, 2017). The contents of the above-referenced patent applications are hereby incorporated by reference in their entirety.

BACKGROUND

An analog-to-digital converter (ADC) is a device that converts an analog input signal to a digital output signal comprising a sequence of bits that represent an amplitude of the analog input signal. An ADC typically has an analog reference voltage or current against which the analog input signal is compared. The digital output signal indicates what fraction of the reference voltage is the amplitude of the analog input signal. Analog-to-digital converters (ADCs) are widely used by modern day digital electronic systems to convert analog signals to digital signals that can be used by the digital electronic systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
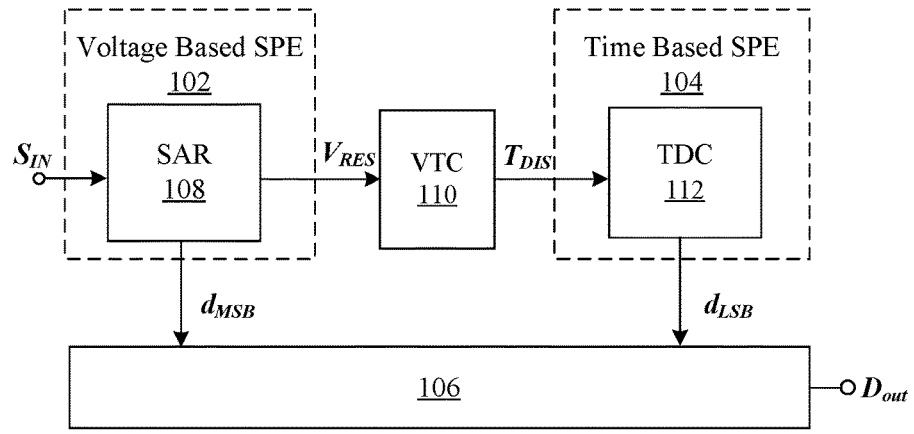
FIG. 1 illustrates a block diagram of some embodiments of a hybrid successive-approximation-register (SAR) analog-to-digital converter (ADC).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Successive-approximation-register analog-to-digital converters (SAR-ADCs) are a type of analog-to-digital converter commonly used in integrated chips. An SAR-ADC converts an analog input signal into a digital output signal having a plurality of bits via a binary search algorithm that converges on the analog input signal. Typically, SAR-ADCs may operate by way of a voltage-based signal processing. In voltage-based signal processing, the analog input signal is converted to a voltage, which is compared to a reference voltage to determine a first bit. After determining a first bit, the SAR-ADC moves to a next bit and performs another comparison to an updated reference voltage generated based upon the first bit. The sequence of comparisons continues until an n-bit digital word is generated.

As the scaling of integrated chips continues, the power efficiency of traditional ADCs using voltage-based signal processing decreases. This is because such ADCs (e.g., Pipelined ADCs) use high gain amplifiers that consume large amounts of power and which are not able to be readily scaled to emerging technology nodes (e.g., to a technology node having a minimum feature size of 16 nm, 10 nm, etc.).

The present disclosure relates to a hybrid SAR-ADC that uses a combination of voltage-based signal processing and time-based signal processing to convert an analog input signal to a digital output signal, and an associated method. In some embodiments, the hybrid SAR-ADC comprises a voltage-based signal processing element configured to convert an analog input signal to a first digital signal having a plurality of most significant bits (MSBs) and to generate a residue voltage from an input voltage and the first digital signal. A voltage-to-time conversion element is configured to convert the residue voltage to a time domain representation. A time-based signal processing element is configured to convert the time domain representation to a second digital signal comprising a plurality of least significant bits (LSBs). By determining the plurality of MSBs using voltage-based signal processing and determining the plurality of LSBs using time-based signal processing, the hybrid SAR-ADC is able to achieve a low power and a compact area.

FIG. 1 illustrates a block diagram of some embodiments of a hybrid successive-approximation-register analog-to-digital converter (SAR-ADC) 100.

The hybrid SAR-ADC 100 comprises a voltage-based signal processing element (SPE) 102 and a time-based signal processing element (SPE) 104, which are collectively configured to convert an analog input signal $S_{IN}$ to a digital output signal $D_{out}$. The voltage-based signal processing element 102 is configured to generate a first digital signal $d_{MSB}$ corresponding to a plurality of most significant bits (MSB), while the time-based signal processing element 104 is configured to generate a second digital signal $d_{LSB}$ corresponding to a plurality of least significant bits (LSB).

In some embodiments, the voltage-based signal processing element 102 comprises a successive-approximation-register (SAR) block 108. The SAR block 108 is configured to implement a binary search algorithm to determine digital values of the first digital signal $d_{MSB}$. The digital values correspond to the analog input signal $S_{IN}$ for the plurality of most significant bits (MSB). The SAR block 108 is also configured to generate a residue voltage $V_{RES}$. The residue voltage $V_{RES}$ corresponds to a difference between an input voltage determined from the analog input signal and a voltage corresponding to the first digital signal $d_{MSB}$.

As the digital values for the first digital signal $d_{MSB}$ are determined, the voltage converges on the analog input signal $S_{IN}$, and the residue voltage $V_{RES}$ (i.e., the difference between the input voltage and the reference voltage) decreases. The VTC element 110 is configured to generate a time domain representation $T_{DIS}$ of the residue voltage $V_{RES}$ by performing a voltage-to-time conversion of the residue voltage $V_{RES}$ output from the SAR block 108. The time domain representation $T_{DIS}$ comprises a pulse having a width that correspond to a value of the residue voltage $V_{RES}$. For example, in some embodiments, a larger residue voltage $V_{RES}$ may cause the time domain representation $T_{DIS}$ to have a pulse with a greater pulse width than a smaller residue voltage.

The time domain representation $T_{DIS}$ is provided to the time-based signal processing element 104. In some embodiments, the time-based signal processing element 104 may comprise a time-to-digital converter 112 configured to convert the time domain representation $T_{DIS}$ to a second digital signal $d_{LSB}$. The second digital signal $d_{LSB}$ has digital values for the plurality of least significant bits (LSB).

The first digital signal $d_{MSB}$ and second digital signal $d_{LSB}$ are provided to a digital output signal generation element 106. The digital output signal generation element 106 is configured to combine the first digital signal $d_{MSB}$ and the second digital signal $d_{LSB}$ to generate a digital output signal $D_{out}$. By employing a combination of voltage-based signal processing and time-based signal processing, the hybrid SAR-ADC 100 is able to achieve a low power and a compact area. This is because the time-based signal processing is able to work at low voltages that allow for the overall power of the hybrid SAR-ADC 100 to be low. Furthermore, the hybrid SAR-ADC 100 offers a resolution that improves with deep submicron scaling (e.g., to a technology node having a minimum feature size of 16, 10 nm, etc.), so as to provide the hybrid SAR-ADC 100 with scalability benefits over traditional SAR-ADCs.

Figure 2:
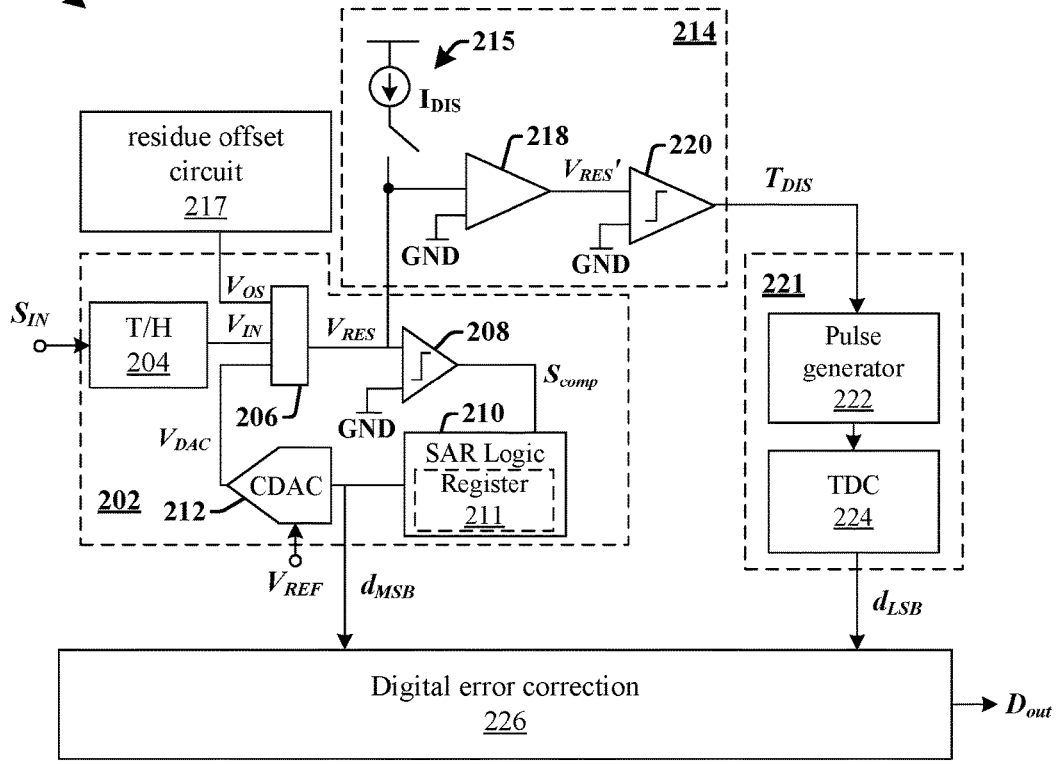
FIG. 2 illustrates some additional embodiments of a hybrid SAR-ADC.

FIG. 2 illustrates some additional embodiments of a hybrid successive-approximation-register analog-to-digital converter (SAR-ADC) 200.

The hybrid SAR-ADC 200 comprises a SAR block 202 configured to generate a first digital signal $d_{MSB}$ corresponding to a plurality of most significant bits (MSBs) of an analog input signal $S_{IN}$. The SAR block 202 comprises a track-and-hold circuit 204 coupled to an input node configured to receive the analog input signal $S_{IN}$. The track-and-hold circuit 204 is configured to sample (i.e., capture) a value of the analog input signal $S_{IN}$ and to hold the sampled value at a constant level for a period of time. The track-and-hold circuit 204 is configured to output the sampled value as an input voltage $V_{IN}$ to an arithmetic unit 206. The arithmetic unit 206 is configured to determine a residue voltage $V_{RES}$, which is equal to a difference of the input voltage $V_{IN}$ and a DAC voltage $V_{DAC}$ output from a capacitive digital-to-analog converter (CDAC) 212.

The residue voltage $V_{RES}$ is provided from the arithmetic unit 206 to a comparator 208. The comparator 208 is configured to make a comparison to determine if the input voltage $V_{IN}$ is greater than or less than the DAC voltage $V_{DAC}$. For example, the comparator 208 is configured to generate a comparator signal $S_{comp}$ based upon a comparison of the residue voltage $V_{RES}$ and a ground potential GND. The comparator signal $S_{comp}$ is used to determine a value of a next bit of the first digital signal $d_{MSB}$. For example, if the input voltage $V_{IN}$ is greater than the DAC voltage $V_{DAC}$, the comparator signal $S_{comp}$ will cause a next bit of the first digital signal $d_{MSB}$ to have a first value (e.g., a "1"), while if the input voltage $V_{IN}$ is less than the DAC voltage $V_{DAC}$ the comparator signal $S_{comp}$ will cause the next bit of the first digital signal $d_{MSB}$ to have a different second value (e.g., a "0").

The comparator signal $S_{comp}$ is provided to a SAR logic unit 210. The SAR logic unit 210 is configured to generate control bits based upon the output of the comparator 208. The CDAC 212 is configured to generate a new DAC voltage $V_{DAC}$ based upon the control bits, which is used to determine a next bit of the first digital signal $d_{MSB}$. In some embodiments, the control bits from successive iterations of a binary search algorithm implemented by the SAR block 202 may be stored in a register 211 within the SAR logic unit 210 and be provided as the first digital signal $d_{MSB}$.

For example, to implement the binary search algorithm, the first digital signal $d_{MSB}$ may be initially set to a value of "100000" (i.e., to have a most significant bit set to "1"). This value may cause the DAC voltage $V_{DAC}$ to be equal to $V_{REF}/2$, where $V_{REF}$ is a reference voltage provided to the CDAC 212. The arithmetic unit 206 determines a residue voltage $V_{RES}$ from a difference between the DAC voltage $V_{DAC}$ and the input voltage $V_{IN}$, and the comparator 208 performs a comparison to determine if the input voltage $V_{IN}$ is greater than or less than the DAC voltage $V_{DAC}$. If the input voltage $V_{IN}$ is greater than the DAC voltage $V_{DAC}$, the comparator 208 outputs a high logical state (i.e., a "1") and the MSB of the first digital signal $d_{MSB}$ remains at 1. Conversely, if the input voltage $V_{IN}$ is less than the DAC voltage $V_{DAC}$, the comparator 208 outputs a low logical state (i.e., a "0") and the MSB of the first digital signal $d_{MSB}$ is changed to the logical low state. The SAR logic unit 210 then moves to a next bit and performs another comparison. The sequence continues for a number of bits until the first digital signal $d_{MSB}$ comprises an n-bit digital word.

The residue voltage $V_{RES}$ is also provided to a voltage-to-time conversion (VTC) element 214. The VTC element 214 is configured to perform a voltage-to-time conversion of the residue voltage $V_{RES}$ to a time domain representation $T_{DIS}$. The VTC element 214 comprises a current source element $I_{DIS}$ 215 which is configured to discharge the reside voltage $V_{RES}$ from the SAR block 202. The time taken to discharge the residue voltage $V_{RES}$ is directly proportional to the value of the residue voltage $V_{RES}$. In some embodiments, a residue offset circuit 217 is configured to provide a offset voltage $V_{OS}$ to the arithmetic unit 206. The offset voltage $V_{OS}$ is configured to cause the residue voltage $V_{RES}$ to discharge in one direction regardless of whether a sign of the residue voltage $V_{RES}$, so that the output of the VTC element 214 is linear.

In some embodiments, the VTC element 214 comprises an amplifier 218 that is configured to amplify the residue voltage $V_{RES}$. The amplified residue voltage $V_{RES}'$ is then provided to a zero crossing detector 220. The zero crossing detector 220 is configured to convert the amplified residue $V_{RES}'$ to a time domain representation $T_{DIS}$. In some embodiments, the zero crossing detector 220 may comprise a comparator configured to generate the time domain representation $T_{DIS}$ by comparing the amplified residue voltage $V_{RES}'$ to a ground potential GND, so that the zero crossing detector 220 produces an output state change whenever the amplified residue $V_{RES}'$ crosses the ground potential GND. In some embodiments, the amplifier 218 may comprise an open loop amplifier. The use of an open loop amplifier minimizes power consumption of the voltage-to-time conversion (VTC) element 214.

The time domain representation $T_{DIS}$ is provided to a time-to-digital conversion element 221 configured to convert the time domain representation $T_{DIS}$ to the second digital signal $d_{LSB}$. In some embodiments, the time-to-digital conversion element 221 may comprise a pulse generator 222 configured to receive the time domain representation $T_{DIS}$ and to generate pulsed stop and start signals that are provided to a time-to-digital converter (TDC) 224. The pulsed stop and start signals are offset in time by an amount that is proportional to the time domain representation $T_{DIS}$. The TDC 224 is configured to convert the pulsed stop and start signals to a second digital signal $d_{LSB}$ corresponding to a plurality of least significant bits (LSBs) of the analog input signal $S_{IN}$.

The first digital signal $d_{MSB}$ and the second digital signal $d_{LSB}$ are provided to a digital error correction element 226 configured to generate a digital output signal $D_{out}$ therefrom. In various embodiments, the first digital signal $d_{MSB}$ and/or the second digital signal $d_{LSB}$ may have any number of bits. In some embodiments, the first digital signal $d_{MSB}$ and/or the second digital signal $d_{LSB}$ may have redundant bits, which can be used by the digital error correction element 226 to determined errors in the hybrid SAR-ADC 200. For example, the first digital signal $d_{MSB}$ may comprise an 8-bit signal and the second digital signal $d_{LSB}$ may comprise a 6-bit signal, which are combined by the digital error correction element 226 to generate a 12-bit digital output signal $D_{out}$. In some embodiments, the digital error correction element 226 may comprise one or more shift registers configured to time-align bits from the first digital signal $d_{MSB}$ and the second digital signal $d_{LSB}$ prior to providing the bits to the digital-error-correction logic.

Figure 3:
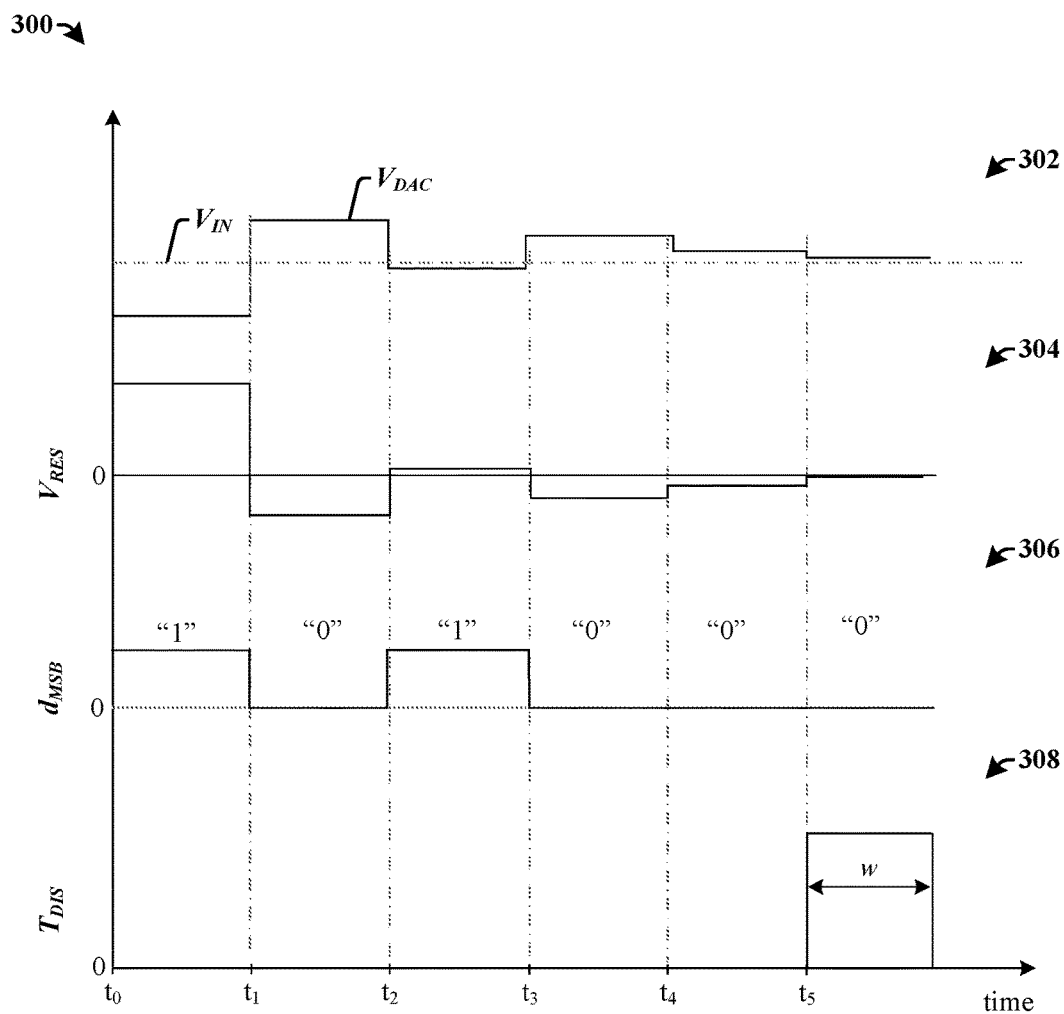
FIG. 3 shows some embodiments of timing diagrams illustrating operation of the hybrid SAR-ADC of FIG. 2.

FIG. 3 shows some embodiments of timing diagrams 300 illustrating operation of the hybrid SAR-ADC 200 of FIG. 2.

Graph 302 shows the DAC voltage $V_{DAC}$ and the input voltage $V_{IN}$ (shown along the y-axis) as a function of time (shown along the x-axis). Graph 304 shows the residue voltage $V_{RES}$ as a function of time. The residue voltage $V_{RES}$ is equal to a difference of the DAC voltage $V_{DAC}$ and the input voltage $V_{IN}$ (i.e., $V_{RES}=V_{DAC}-V_{IN}$). As shown in graph 304, as the SAR block 202 determines more bits of the first digital signal $d_{MSB}$, the residue voltage $V_{RES}$ approaches zero (i.e., the DAC voltage $V_{DAC}$ converges upon the input voltage $V_{IN}$).

Graph 306 illustrates the first digital signal $d_{MSB}$ (i.e., the control bits of the SAR logic element). Initially, the first digital signal $d_{MSB}$ is set to "100000." During a first time period from $t_0$ to $t_1$ a first comparison is performed. Since the residue voltage $V_{RES}$ is greater than 0 (i.e., the input voltage $V_{IN}$ is greater than the DAC voltage $V_{DAC}$), the MSB remains at 1, as shown in graph 306. During a second time period, from $t_1$ to $t_2$, a second comparison is performed. Since the residue voltage $V_{RES}$ is less than 0 (i.e., the input voltage $V_{IN}$ is less than the DAV voltage $V_{DAC}$), a second bit remains at 0, so that the DAC is set to "100000." During a third time period, from $t_2$ to $t_3$, a third comparison is performed. Since the residue voltage $V_{RES}$ is greater than 0, a third bit is changed to "1", so that the control bits of the SAR logic element are set to "101000." Successive comparisons result in a first digital signal $d_{MSB}$ having a value of "101000."

Graph 308 illustrates a time domain representation $T_{DIS}$ of the residue voltage $V_{RES}$. The time domain representation $T_{DIS}$ has a pulse comprising a width w that is dependent upon the residue voltage $V_{RES}$. A second digital signal $d_{LSB}$ is generated from the time domain representation $T_{DIS}$. Since the time domain representation $T_{DIS}$ corresponds to a residue of the SAR block 202, the second digital signal $d_{LSB}$ corresponds to a LSB of the analog input signal.

Figure 4:
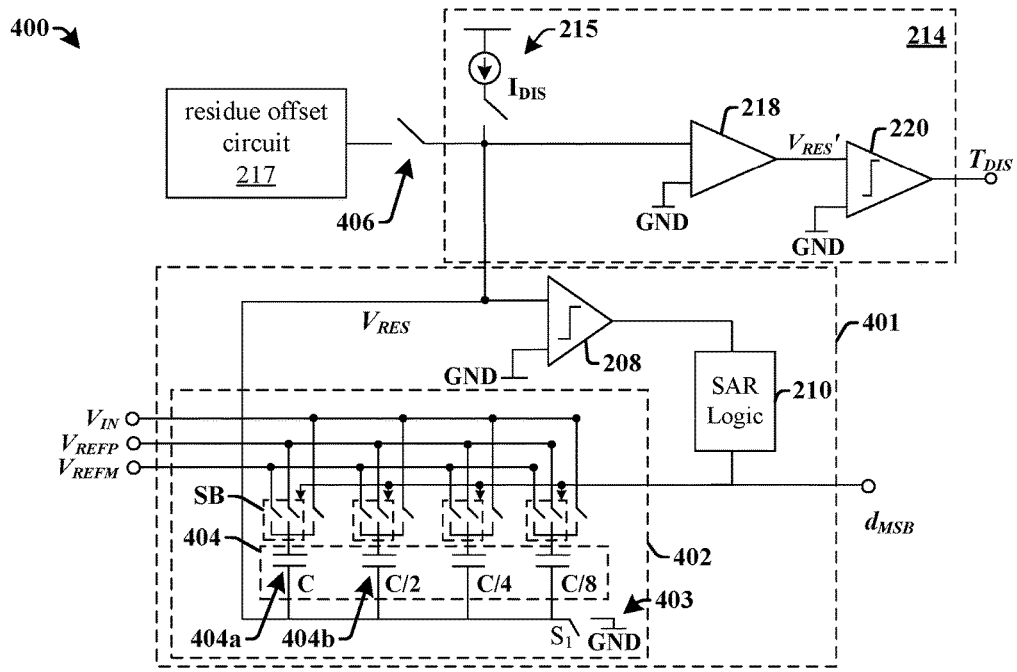
FIG. 4 illustrates a more detailed embodiment of a voltage-based signal processing element within a hybrid SAR-ADC.

FIG. 4 illustrates a more detailed embodiment of a hybrid successive-approximation-register analog-to-digital converter (SAR-ADC) 400.

The hybrid SAR-ADC 400 comprises a SAR block 401 and a VTC element 214. The SAR block 401 is configured to generate a first digital signal $d_{MSB}$ corresponding to a plurality of most significant bits (MSB) of an input voltage $V_{IN}$. The VTC element 214 is configured to receive a residue voltage $V_{RES}$ from the SAR block 401 and to generate a time domain representation $T_{DIS}$ of the residue voltage $V_{RES}$. In some embodiments, a residue offset circuit 217 configured to generate an offset voltage $V_{OS}$ is selectively coupled to the VTC element 214 by way of a switching element 406.

The SAR block 401 comprises a capacitive digital-to-analog converter (CDAC) 402 connected to an output of SAR logic unit 210. The CDAC 402 comprises a plurality of capacitors 404 coupled between a common terminal 403 and free terminals. The plurality of capacitors 404 have binary weighted values. The common terminal 403 is selectively coupled to a ground potential GND by way of a first switching element $S_1$. The free terminals are selectively coupled to the input voltage $V_{IN}$ and/or one or more reference voltages $V_{REFM}$ and $V_{REFP}$ by way of additional switching elements SB.

During an acquisition phase, the common terminal 403 is held at the ground potential GND and the free terminals are connected to an input voltage $V_{IN}$. After the acquisition phase, the common terminal 403 is disconnected from the ground potential GND and the free terminals are disconnected from the input voltage $V_{IN}$, causing the plurality of capacitors 404 to hold a charge that is proportional to the input voltage $V_{IN}$. The free terminals of the plurality of capacitors 404 are then connected to a minimum reference voltage $V_{REFM}$ (e.g., ground), driving the common terminal 403 to a voltage equal to $-V_{IN}$. The MSB capacitor is then disconnected from the minimum reference voltage $V_{REFM}$ and connected to a maximum reference voltage $V_{REFP}$, driving the common terminal 403 in the positive direction by an amount equal to $\frac{1}{2}V_{REF}$ so that $V_{DAC}=-V_{IN}+\frac{1}{2}V_{REF}$. The comparator 208 is configured to output a 1 if $V_{RES}<0$ or a 0 if $V_{RES}>0$. If the comparator 208 outputs a 1, then the MSB capacitor 404a stays connected to a maximum reference voltage $V_{REFP}$. Otherwise, the MSB capacitor 404a is connected back to the minimum reference voltage $V_{REFM}$ (e.g., ground). The next smaller capacitor 404b is then connected to the minimum reference voltage $V_{REFM}$ and the new DAC voltage $V_{DAC}$ is compared with the minimum reference voltage $V_{REFM}$. This process continues until the first digital signal $d_{MSB}$ has been determined.

Figure 5:
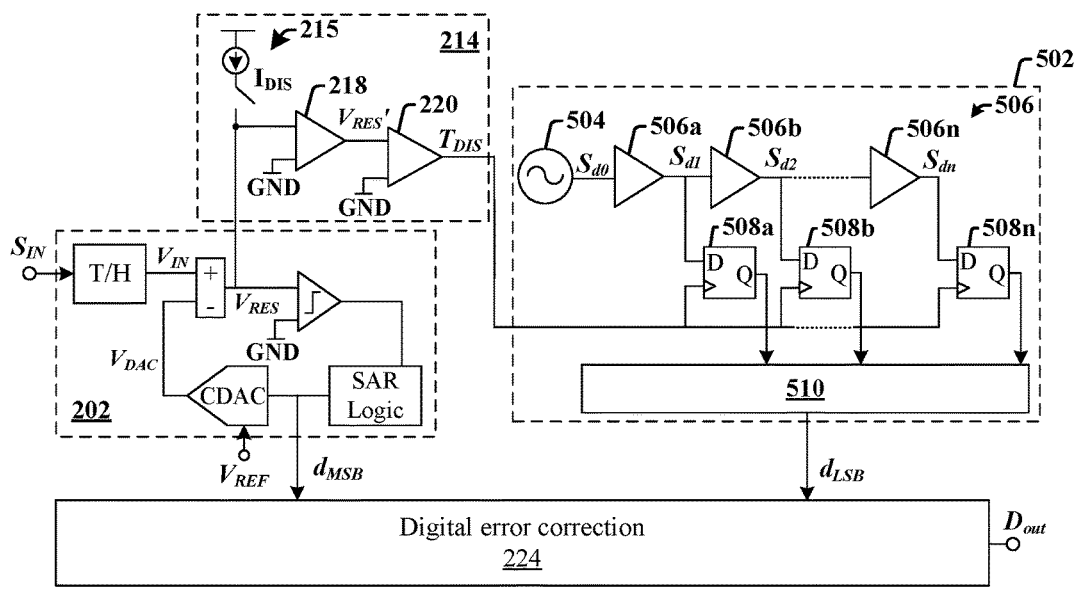
FIG. 5 illustrates a more detailed embodiment of a time-based signal processing element within a hybrid SAR-ADC.

FIG. 5 illustrates a more detailed embodiment of a time-based signal processing element 502 within a hybrid SAR-ADC 500.

The time-based signal processing element 502 is configured to receive a time domain representation $T_{DIS}$ of a residue voltage $V_{RES}$ from a voltage-to-time conversion (VTC) element 214. In some embodiments, the time-based signal processing element 502 may comprise a time-to-digital converter (TDC). The time-based signal processing element 502 comprises a tapped delay line 506 comprising a plurality of delay elements 506a-506n arranged in series to a pulse generator 504. The plurality of delay elements 506a-506n are configured to introduce a delay into a start signal $S_{d0}$ generated by the pulse generator 504 to generate a plurality of delayed signals $S_{d1}$-$S_{dn}$.

The plurality of delay elements 506a-506n respectively have an output coupled to a D-input of a corresponding flip-flop 508a-508n. The flip-flops 508a-508n further comprise a clock input. In some embodiments, the clock input is coupled to the time domain representation $T_{DIS}$, which acts as a stop signal. In other embodiments, the clock input may be coupled to a pulse generator (not shown) configured to generate a stop signal that is delayed with respect to the start signal $S_{d0}$ by an amount that is proportional to the time domain representation $T_{DIS}$ of the residue voltage $V_{RES}$.

The state of the tapped delay line 506 is sampled at a time of arrival of the time domain representation $T_{DIS}$, such that a rising/falling edge of the time domain representation $T_{DIS}$ (i.e., the stop signal) latches the status of the tapped delay line 506. In some embodiments, the output of the plurality of flip flops 508a-508n may be provided to a thermometer code converter 510 configured to generate the second digital output signal $d_{LSB}$.

Since the VTC element 214 has represented the residue voltage $V_{RES}$ as a time domain representation $T_{DIS}$ in which the zero crossing point is indicated by a rising/falling edge, the time-based signal processing element 502 determines a values of the second digital signal $d_{LSB}$ from when the rising/falling edge occurs (i.e., that indicates a digital value of the residue voltage $V_{RES}$ using time domain signal processing). In other words, a time interval between start signal $S_{d0}$ and a rising/falling edge of the time domain representation $T_{DIS}$ is proportional to the number of flip-flops that were sampled as transparent, so that the outputs of the flip-flops 508a-508n define a second digital signal $d_{LSB}$ having bits with values that depend upon the residue voltage $V_{RES}$ (e.g., a first time difference may provide for a second digital signal $d_{LSB}$ having a first sequence of bits (e.g., "1000") while a second time difference may provide for a second digital signal $d_{LSB}$ having a second sequence of bits (e.g., "1110")).

Figure 6A:
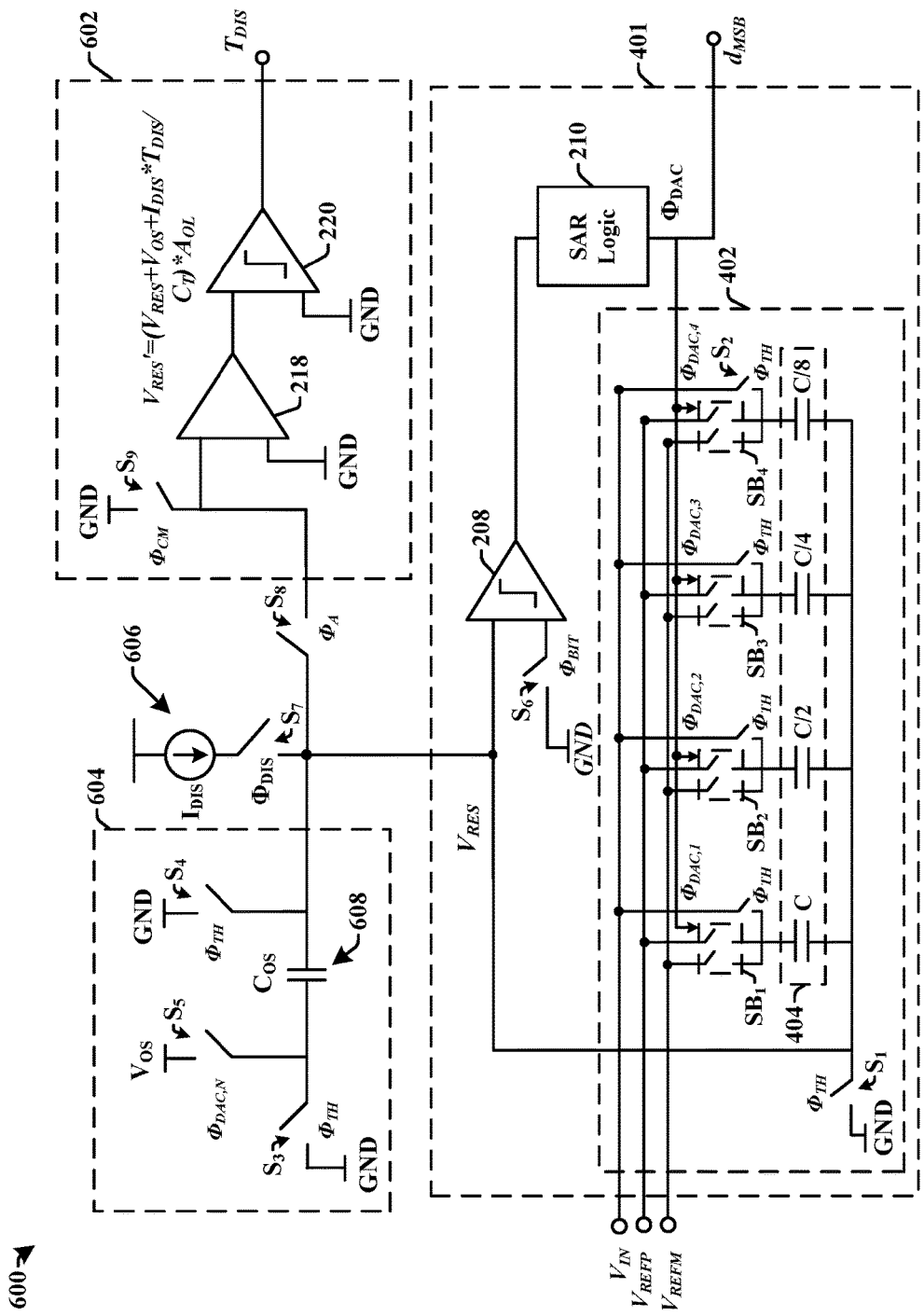
FIGS. 6A-6B illustrate a more detailed embodiment of a voltage-to-time conversion element within a disclosed hybrid SAR-ADC.
Figure 6B:
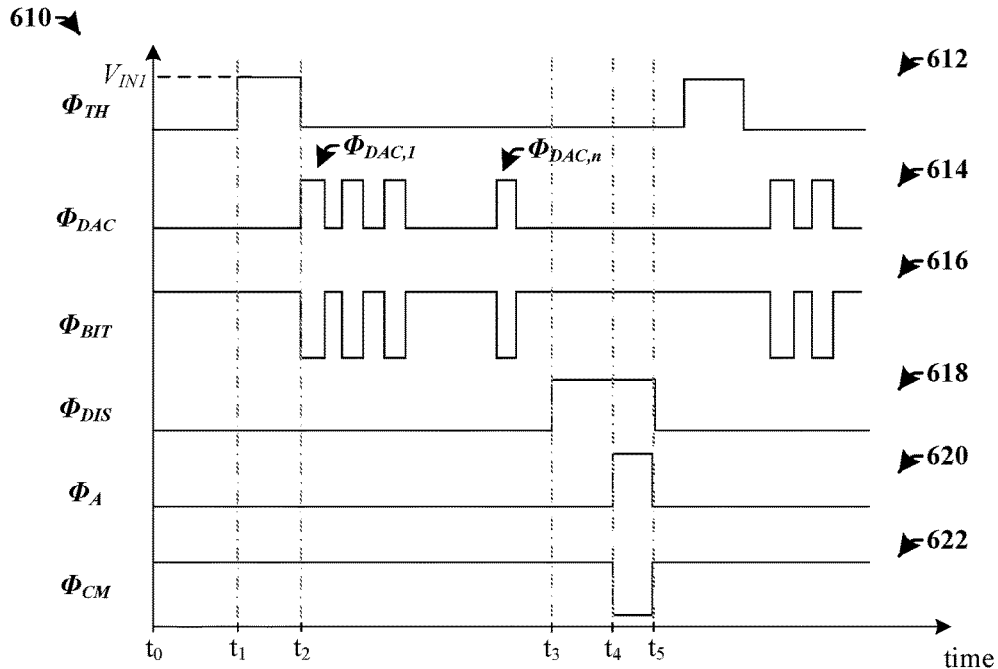

FIGS. 6A-6B illustrates a more detailed embodiment of a voltage-to-time conversion element 602 within a hybrid SAR-ADC 600.

The hybrid SAR-ADC 600 comprises a SAR block 401 comprising a SAR logic unit 210 configured to generate a DAC control signal $\Phi_{DAC}$ having a plurality of bits. The DAC control signal $\Phi_{DAC}$ is provided to the CDAC 402 to control biasing of a plurality of capacitors 404 within the CDAC 402. Based upon the DAC control signal $\Phi_{DAC}$, the CDAC 402 will output a DAC voltage $V_{DAC}$. The DAC voltage $V_{DAC}$ is provided to an arithmetic unit 206 that is configured to subtract the DAC voltage $V_{DAC}$ from an input voltage $V_{IN}$ to generate a residue voltage $V_{RES}$. The residue voltage $V_{RES}$ is provided to a voltage-to-time conversion (VTC) element 602.

The VTC element 602 comprises an amplifier 218 connected to the arithmetic unit 206 and a zero crossing detector 220 connected to the amplifier 218. The amplifier 218 is further connected to a discharge current source 606 configured to generate a discharge current $I_{DIS}$ that discharges the plurality of capacitors 404 within the CDAC 402. The time it takes to discharge the plurality of capacitors 404 is proportional to the residue voltage $V_{RES}$. Therefore, when the zero crossing point of the residue voltage $V_{RES}$ is reached, the zero crossing detector 220 will generate a time domain representation $T_{DIS}$ comprising a pulse having a width that is a proportional to the residue voltage $V_{RES}$. The time domain representation $T_{DIS}$ may be subsequently converted to a second digital signal comprising the plurality of least significant bits.

In some embodiments, a residue offset circuit 604 is connected to an amplifier 218. The residue offset circuit 604 is configured to cause the residue voltage $V_{RES}$ to discharge in one direction (e.g., to discharge from a positive value to zero or to discharge from a negative value to zero), regardless of whether the residue voltage $V_{RES}$ is positive or negative. By causing the residue voltage $V_{RES}$ to discharge in one direction, the time domain representation $T_{DIS}$ is linear regardless of the characteristics of the amplifier 218.

The residue offset circuit 604 comprises a COS capacitive element 608. The COS capacitive element 608 is selectively coupled to a ground potential GND and to an offset voltage source $V_{OS}$ by way of switching elements $S_3$-$S_5$. The COS capacitive element 608 is also coupled to the discharge current source 606 by way of switching element $S_6$. When the discharge current source 606 generates the discharge current $I_{DIS}$, the COS capacitive element 608 also discharges to provide a residue offset voltage $V_{OS}$ to the amplifier 218.

FIG. 6B illustrates timing diagrams 610 illustrating operation of the hybrid SAR-ADC 600 of FIG. 6A.

Graph 612 illustrates an input signal $\Phi_{TH}$ corresponding to the input voltage $V_{IN}$ output from the track-and-hold circuit 204. The input signal $\Phi_{TH}$ is held at a value of an analog input signal for a period of time. For example, at time $t_1$ the input signal $\Phi_{TH}$ is held at a first value $V_{IN1}$ for a time period that extends from time $t_1$ to time $t_2$. At other times the input signal $\Phi_{TH}$ is held low. At a first time t1, when the input signal $\Phi_{TH}$ is high, switching elements $S_1$-$S_4$ are closed, thereby initializing (e.g., connecting to GND) the capacitors within the CDAC 402 and also resetting the capacitance value of the COS capacitive element 608. At a second time $t_2$, when the input signal $\Phi_{TH}$ is low, switching elements $S_1$-$S_4$ are open, thereby disconnecting the capacitors from the ground potential GND.

Graph 614 illustrates DAC control signal $\Phi_{DAC}$ provided to the CDAC 402 to control biasing of a plurality of capacitors 404 within the CDAC 402. The DAC control signal is configured to generate a plurality of pulses $\Phi_{DAC,1}$-$\Phi_{DAC,4}$, which sequentially bias the plurality of capacitors 404 in the CDAC 402 by operating switching blocks $SB_1$-$SB_4$ to connect the plurality of capacitors 404 to an input voltage and/or one or more reference voltages as described above.

Graph 616 illustrates a control bit signal $\Phi_{BIT}$ that operates switching element $S_7$ to selectively couple the comparator 208 to a ground potential GND. The comparator 208 performs a comparison on a falling edge of the control bit signal $\Phi_{BI}$.

Graph 618 illustrates a residue voltage discharge signal $\Phi_{DIS}$ that operates switching element $S_6$ to selectively couple the discharge current source 606 to CDAC 402 and to COS capacitive element 608. For example, at a time t3, when the residue voltage $V_{RES}$ is generated from the first digital signal $d_{MSB}$, the residue voltage discharge signal $\Phi_{DIS}$ is set to high to couple the discharge current source 606 to the CDAC 402 and to the COS capacitive element 608. The discharge current causes charges from the plurality of capacitors 404 within the CDAC 402 and the COS capacitive element 608 to start discharging in a linear fashion. Once the plurality of capacitors 404 within the CDAC 402 have discharged and the residue voltage $V_{RES}$ is equal to the ground potential GND, the amplifier 218 outputs a signal that causes the zero crossing detector 220 to generate a pulse that is proportional to the residue voltage $V_{RES}$.

Graph 620 illustrates an amplifier control signal $\Phi_A$. The amplifier control signal $\Phi_A$ operates switching element $S_8$ to selectively couple the amplifier 218 to the SAR block 401 and the residue offset circuit 604. For example, at time $t_4$, the amplifier control signal $\Phi_A$ is set to high to close switching element $S_8$, so that a sum of the residue voltage $V_{RES}$ and the residue offset voltage $V_{OS}$ is provided to the amplifier 218. The resulting output voltage Vo of the amplifier is equal to $Vo=[(V_{IN}-V_{DAC})+V_{OS}-I_{DIS}*T_{DIS}/C_T]*A_{OL}$, so that the zero-crossing of the output voltage Vo is detected at $T_{DIS}=(V_{IN}-V_{DAC}+V_{OS})*C_T/I_{DIS}$ (where $C_T$ is equal to the sum of the capacitors 404). Therefore, time domain representation $T_{DIS}$ at zero crossing is linear regardless of the characteristics of the amplifier 218, so that the amplifier 218 may comprise a low power open loop amplifier with a moderately linear low gain.

Graph 622 illustrates an amplifier reset signal $\Phi_{CM}$. The amplifier reset signal $\Phi_{CM}$ operates switching element $S_9$ to selectively couple the amplifier 218 to a ground potential GND. For example, at time $t_5$, the amplifier reset signal $\Phi_{CM}$ is set to high to close switch $S_9$ so that the value of the time domain representation $T_{DIS}$ goes low.

Figure 7:
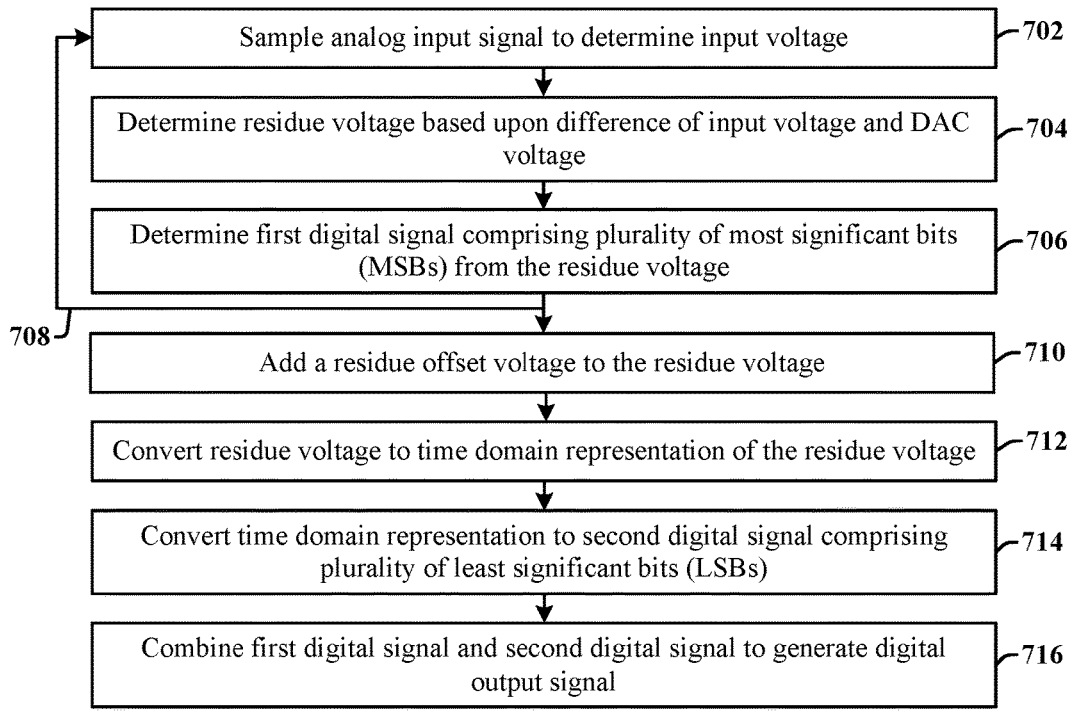
FIG. 7 illustrates a flow diagram of some embodiments of a method of performing an analog-to-digital conversion using voltage-based signal processing and time-based signal processing.

FIG. 7 illustrates a flow diagram of some embodiments of a method 700 of performing an analog-to-digital conversion using voltage-based signal processing and time-based signal processing.

While the disclosed method 700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At operation 702, an analog input signal is sampled to determine an input voltage.

At operation 704, a residue voltage is determined based upon a difference of an input voltage and a DAC voltage determined from the first digital signal.

At operation 706, a first digital signal comprising a plurality of most significant bits (MSBs) is determined from the residue voltage. In some embodiments, acts 702-706 may be repeated multiple times (as shown by arrow 708) to determine a plurality of bits for the first digital signal.

At operation 710 a residue offset voltage is added to the residue voltage, in some embodiments.

At operation 712, the residue voltage is converted to a time domain representation of the residue voltage.

At operation 714, the time domain representation is converted to a second digital signal comprising a plurality of least significant bits (LSBs).

At operation 716, the first digital signal and the second digital signal are combined to generate a digital output signal.

Therefore, the present disclosure relates to an analog-to-digital converter (ADC) that uses a combination of voltage-based signal processing and time-based signal processing to convert an analog input signal to a digital output signal, and an associated method of formation.

In some embodiments, the present disclosure relates to an analog to digital converter (ADC). The ADC includes a voltage-based signal processing element configured to receive an input signal and to generate a first digital signal having a plurality of most significant bits and a residue voltage. A residue offset circuit is configured to provide a residue offset voltage to the residue voltage, and a voltage-to-time conversion element is configured to convert a sum of the residue voltage and the residue offset voltage to a time domain representation. A time-based signal processing element is configured to convert the time domain representation to a second digital signal having a plurality of least significant bits.

In other embodiments, the present disclosure relates to an analog to digital converter (ADC). The ADC includes a voltage-based signal processing element configured to receive an input signal and to generate a first digital signal having a first number of most significant bits and a residue voltage. A voltage-to-time conversion element is configured to convert the residue voltage to a time domain representation, and a time-based signal processing element is configured to convert the time domain representation to a second digital signal comprising a second number of least significant bits. A digital error correction element is configured to receive the first digital signal and the second digital signal and to generate a digital output signal therefrom. The digital output signal has a third number of bits that is less than a sum of the first number and the second number.

In yet other embodiments, a method of performing an analog-to-digital conversion. The method includes generating a first digital signal having a first number of most significant bits based upon an analog input signal, and determining a residue voltage based upon the first digital signal. The method further includes adding a residue offset voltage to the residue voltage, and converting a sum of the residue voltage and the residue offset voltage to a time domain representation. The method further includes converting the time domain representation to a second digital signal having a second number of least significant bits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter (ADC), comprising:
a successive approximation register configured to receive an input signal and to generate a first digital signal and a residue voltage;

a voltage-to-time conversion element configured to convert the residue voltage to a time domain representation, the voltage-to-time conversion element comprising:
an amplifier comprising an input coupled to an output of the successive approximation register;
a zero crossing detector directly coupled to an output of the amplifier; and
a time-to-digital converter coupled to an output of the zero crossing detector and configured to generate a second digital signal.

2. The ADC of claim 1, wherein the successive approximation register comprises:
an arithmetic unit having a first input and a second input;
a comparator coupled to an output of the arithmetic unit;
a successive approximation register (SAR) logic unit coupled to an output of the comparator;
a capacitive digital-to-analog converter (CDAC) coupled to an output of the SAR logic unit and to the first input of the arithmetic unit; and
a track-and-hold circuit having an input configured to receive the input signal and an output coupled to the second input of the arithmetic unit.

3. The ADC of claim 2,
wherein the track-and-hold circuit is configured to provide a voltage to the second input of the arithmetic unit, the voltage having a value that corresponds to a value of the input signal at a first time; and
wherein the arithmetic unit is configured to generate the residue voltage based upon the voltage and a signal output from the CDAC.

4. The ADC of claim 2,
wherein the CDAC comprises a plurality of capacitors; and
wherein the time domain representation is proportional to a sum of capacitances of the plurality of capacitors.

5. The ADC of claim 1, wherein the zero crossing detector comprises a comparator configured to generate the time domain representation by comparing a voltage that is output from the amplifier to a ground potential.

6. The ADC of claim 1, wherein the time-to-digital converter comprises:
a plurality of delay elements arranged in series;
a plurality of flip-flops, wherein the plurality of delay elements respectively have an output coupled to a first input of a corresponding one of the plurality of flip-flops and wherein the plurality of flip-flops further comprise a second input that is coupled to the output of the zero crossing detector; and
a thermometer code converter coupled to outputs of the plurality of flip-flops, wherein the thermometer code converter is configured to generate the second digital signal.

7. The ADC of claim 1, wherein the amplifier comprises an open loop amplifier configured to provide the voltage-to-time conversion element with a low power consumption.

8. The ADC of claim 1, further comprising:
a digital error correction circuit configured to receive the first digital signal and the second digital signal and to output a digital output signal.

9. The ADC of claim 1, further comprising:
a residue offset circuit coupled to the input of the amplifier, wherein the residue offset circuit is configured to provide a residue offset voltage that causes the voltage-to-time conversion element to generate the time domain representation as a linear function.

10. An analog-to-digital converter (ADC), comprising:
a successive-approximation-register block configured to receive an input signal and to generate a first digital signal and a residue voltage;
a residue offset circuit configured to generate a residue offset voltage;
a conversion element comprising an amplifier that is configured to output an output voltage that is a function of the residue voltage and the residue offset voltage and a comparator configured to convert the output voltage to a time domain representation of the residue voltage; and
a time-to-digital converter configured to generate a second digital signal from the time domain representation.

11. The ADC of claim 10, wherein the time domain representation that is output from the conversion element is a linear function.

12. The ADC of claim 10, further comprising:
a discharge current source operably coupled to an input of the amplifier and an output of the successive-approximation-register block, wherein the discharge current source is configured to generate a discharge current; and
a capacitive element selectively coupled to a ground potential by way of a first switching element, to an offset voltage source by way of a second switching element, and to the discharge current source by way of a third switching element.

13. The ADC of claim 12, further comprising:
a fourth switching element disposed between the discharge current source and the input of the amplifier.

14. The ADC of claim 12, wherein the output voltage generated by the amplifier is proportional to a product of the discharge current and a gain of the amplifier.

15. A method of performing an analog to digital conversion, comprising:
operating a successive approximation register to generate a first digital signal and a residue voltage from an analog input signal;
operating a voltage-to-time conversion element to generate a time domain representation based upon the residue voltage and a residue offset voltage; and
operating a time-to-digital converter to generate a second digital signal based upon the time domain representation.

16. The method of claim 15, further comprising:
generating a discharge current that is configured to cause the residue voltage to discharge from the successive approximation register.

17. The method of claim 15, wherein the time domain representation is proportional to the residue offset voltage.

18. The method of claim 15, wherein the time domain representation is a linear function.

19. The method of claim 15, further comprising:
operating a first switching element to couple a discharge current from a discharge current source to an output of the successive approximation register at a first time; and
operating a second switching element to couple the output of the successive approximation register to an input of the voltage-to-time conversion element at a second time after the first time.

20. The method of claim 19, further comprising:
operating the first switching element to decouple the discharge current from the output of the successive approximation register at a third time after the second time; and operating the second switching element to decouple the output of the successive approximation register from the input of the voltage-to-time conversion element at the third time.

* * * * *